(12) United States Patent
Taya

(10) Patent No.: US 10,488,442 B2
(45) Date of Patent: Nov. 26, 2019

(54) WIRELESS POWER FEEDING DEVICE, WIRELESS POWER RECEIVING DEVICE, WIRELESS POWER SUPPLY SYSTEM, AND METHOD FOR MEASURING CURRENT OF WIRELESS POWER FEEDING DEVICE

(71) Applicant: LAPIS Semiconductor Co., Ltd., Yokohama (JP)

(72) Inventor: Takashi Taya, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 184 days.

(21) Appl. No.: 15/820,367

(22) Filed: Nov. 21, 2017

(65) Prior Publication Data
US 2018/0143223 A1 May 24, 2018

(30) Foreign Application Priority Data
Nov. 22, 2016 (JP) ................. 2016-227041

(51) Int. Cl.
| | | |
|---|---|---|
| *G01R 15/14* | (2006.01) | |
| *H02J 50/12* | (2016.01) | |
| *H02H 9/04* | (2006.01) | |
| *H02J 7/00* | (2006.01) | |
| *H02J 7/02* | (2016.01) | |
| *H02J 7/04* | (2006.01) | |
| *H02J 50/60* | (2016.01) | |

(Continued)

(52) U.S. Cl.
CPC ............ *G01R 15/146* (2013.01); *H02H 9/04* (2013.01); *H02J 7/0031* (2013.01); *H02J 7/025* (2013.01); *H02J 7/045* (2013.01); *H02J 7/047* (2013.01); *H02J 50/12* (2016.02); *H02J 50/60* (2016.02); *G01R 19/16547* (2013.01); *G01R 31/42* (2013.01); *H02J 2007/0039* (2013.01)

(58) Field of Classification Search
CPC .......... H02J 50/12; H02J 7/0031; H02J 7/047; H02J 2007/0039; H02J 50/60; G01R 15/146; G01R 19/16547; G01R 31/42; H02H 9/04
See application file for complete search history.

(56) References Cited

U.S. PATENT DOCUMENTS

| | | | |
|---|---|---|---|
| 2015/0349541 A1* | 12/2015 | Yamamoto | ............... G01V 3/10 307/104 |
| 2015/0349542 A1* | 12/2015 | Yamamoto | ............... G01V 3/10 307/104 |

(Continued)

FOREIGN PATENT DOCUMENTS

JP          2016-092921 A       5/2016

*Primary Examiner* — Jared Fureman
*Assistant Examiner* — Duc M Pham
(74) *Attorney, Agent, or Firm* — Rabin & Berdo, P.C.

(57) ABSTRACT

A wireless power feeding device includes first to Nth (N is an integer of 2 or more) switching elements connected in parallel to each other between a power line, which is connected to one end of a power transmission coil, and a ground line, each of the first to Nth switching elements supplying a current to the drive line in accordance with an oscillation signal; a first resistor connected in series with the first switching element between the power line and the ground line; and a current measurement circuit for generating a first measured current signal representing the amount of the drive current on the basis of the potential of one end of the first resistor.

10 Claims, 8 Drawing Sheets

(51) Int. Cl.
*G01R 19/165* (2006.01)
*G01R 31/42* (2006.01)

(56) References Cited

U.S. PATENT DOCUMENTS

2017/0040843 A1* 2/2017 Asanuma ................ H02J 7/025
2017/0098963 A1* 4/2017 Takahashi ............... H02J 50/12

* cited by examiner

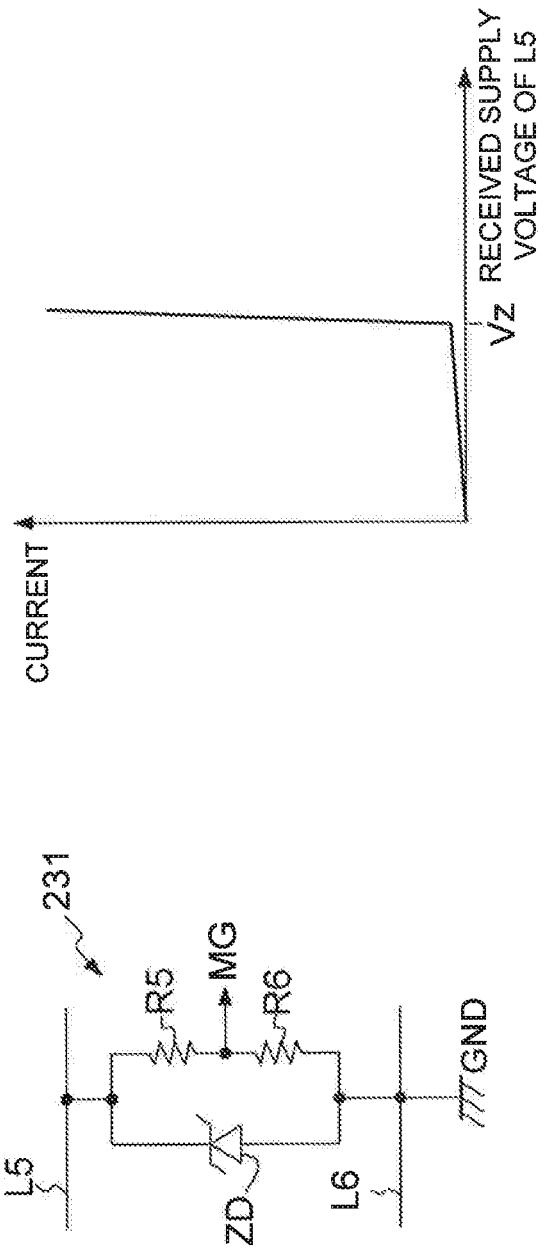

— WIRELESS POWER FEEDING DEVICE, WIRELESS POWER RECEIVING DEVICE, WIRELESS POWER SUPPLY SYSTEM, AND METHOD FOR MEASURING CURRENT OF WIRELESS POWER FEEDING DEVICE

BACKGROUND OF THE INVENTION

1. Field of the Invention

The present invention relates to a wireless power feeding device for feeding power in a non-contact manner, a wireless power receiving device for receiving power in a non-contact manner, a wireless power supply system including the wireless power feeding device and the wireless power receiving device, and a method for measuring a current of the wireless power feeding device.

2. Description of the Related Art

In recent years, wireless power supply systems for feeding power in a non-contact manner are proposed to supply power to wearable devices such as watches, IC (integrated circuit) cards, and the like. In the wireless power supply system, power is transmitted and received between a coil (power transmission coil) of a power transmission device and a coil (power reception coil) of a power reception device disposed oppositely.

At present, various frequencies, for example, 6.78 MHz, 13.56 MHz, and the like are used as frequencies for alternating current magnetic fields for wireless power supply. By the way, when a foreign object is present between an IC card having a power reception device that receives power by resonance with an alternating current magnetic field of, for example, 13.56 MHz and a power transmission device, the IC card may generate heat and break.

Accordingly, a non-contact power supply device disclosed in Japanese Patent Application Laid-Open No. 2016-92921 detects a current flowing through a power transmission coil in a power transmission device, and stops a power supply when the detected current value exceeds a certain threshold value.

However, in the above-described non-contact power supply device, since a current sensor is provided in series between a power line and a power transmission circuit to detect a current flowing through the power transmission coil, the current sensor itself causes power loss.

Therefore, the present invention aims at providing a wireless power feeding device that can measure a current flowing through a circuit with low power loss, a wireless power receiving device, a wireless power supply system, and a method for measuring a current of the wireless power feeding device.

SUMMARY OF THE INVENTION

The wireless power feeding device according to the present invention is a wireless power feeding device for performing wireless power feeding via a power transmission coil by supplying a drive current to the power transmission coil on the basis of an oscillation signal so as to generate an alternating current magnetic field, the wireless power feeding device comprising: a drive line having one end thereof connected to one end of the power transmission coil; first to Nth (N is an integer of 2 or more) switching elements connected in parallel to each other between a power line and a ground line, each of the first to Nth switching elements supplying a current to the other end of the drive line in response to the oscillation signal; a first resistor connected in series with the first switching element between the power line and the ground line; and a current measurement circuit for generating a first measured current signal representing an amount of the drive current on the basis of a potential of one end of the first resistor.

The wireless power receiving device according to the present invention is a wireless power receiving device for receiving a rectified voltage of an alternating current voltage obtained by a power reception coil in an alternating current magnetic field as a received supply voltage, and generating an output voltage having a predetermined voltage value on the basis of the received supply voltage, the wireless power receiving device comprising: a first line for receiving the received supply voltage; an excessive magnetic field protection circuit for generating a magnetic field strength signal representing a strength of the alternating current magnetic field on the basis of the received supply voltage of the first line, and when the strength of the alternating current magnetic field is higher than a predetermined strength, the excessive magnetic field protection circuit fixing a voltage value of the first line at a predetermined voltage; and a stabilization circuit including a current detection unit for measuring an amount of a current flowing through the first line and generating a measured current signal representing the amount of the current; an overcurrent detection unit for detecting an overcurrent flowing through the first line and generating an overcurrent detection signal representing the overcurrent; a voltage detection unit for measuring the voltage value of the output voltage and generating a measured voltage signal representing the voltage value; and a voltage adjustment unit for adjusting the voltage value of the first line on the basis of a difference between a potential of one of the measured current signal, the overcurrent detection signal, and the measured voltage signal having the highest strength and a reference potential, and outputting the adjusted voltage as the output voltage.

The wireless power supply system according to the present invention is a wireless power supply system comprising: a wireless power feeding device including a power transmission circuit for generating a drive current on the basis of an oscillation signal, and a power transmission coil for generating an alternating current magnetic field by receiving the drive current; and a wireless power receiving device including a power reception coil for generating an alternating current voltage by receiving the alternating current magnetic field, a rectifier circuit for obtaining a rectified voltage of the alternating current voltage as a received supply voltage, and a power reception circuit for generating an output voltage having a predetermined voltage value on the basis of the received supply voltage, wherein the power transmission circuit includes: a drive line having one end thereof connected to one end of the power transmission coil; first to Nth (N is an integer of 2 or more) switching elements connected in parallel to each other between a power line and a ground line, each of the first to Nth switching elements supplying a current to the other end of the drive line in response to the oscillation signal; a first resistor connected in series with the first switching element between the power line and the ground line; and a current measurement circuit for generating a first measured current signal representing an amount of the drive current on the basis of a potential of one end of the first resistor, and the power reception circuit includes: first line for receiving the received supply voltage; an excessive magnetic field protection circuit for generating a magnetic field strength signal representing a strength of the alternating current magnetic field on the basis of the received supply voltage of the first line, and when the strength of the alternating current magnetic field is higher than a predetermined strength, the excessive magnetic field protection circuit fixing a voltage value of the first line at a predetermined voltage; and a stabilization circuit including a current detection unit for measuring an amount of a current flowing through the first line and generating a measured current signal representing the amount of the current; an overcurrent detection unit for detecting an overcurrent flowing through the first line and generating an overcurrent detection signal representing the overcurrent; a voltage detection unit for measuring the voltage value of the output voltage and generating a measured voltage signal representing the voltage value; and a voltage adjustment unit for adjusting the voltage value of the first line on the basis of a difference between a potential of one of the measured current signal, the overcurrent detection signal, and the measured voltage signal having the highest strength and a reference potential, and outputting the adjusted voltage as the output voltage.

The method for measuring a current of a wireless power feeding device according to the present invention is a method for measuring a current of a wireless power feeding device, the wireless power feeding device performing wireless power feeding via a transmission coil by supplying a drive current to the power transmission coil on the basis of an oscillation signal so as to generate an alternating current magnetic field, the method comprising: intermittently outputting a current from each of first to Nth (N is an integer of 2 or more) switching elements in accordance with the oscillation signal, and supplying a composite current into which the currents outputted from the first to Nth switching elements are combined to the power transmission coil as the drive current; and generating a measured current signal representing an amount of the drive current on the basis of a potential of one end of a resistor connected in series to only the first switching element of the first to Nth switching elements.

According to the present invention, the composite current into which the currents outputted from the N number of switching elements connected in parallel are combined is supplied to the power transmission coil as the drive current. The current measurement resistor is connected in series to one of the N number of switching elements, and the measured current signal representing the amount of the drive current is generated on the basis of the potential of the one end of the resistor. Thus, since one-Nth of the drive current flows through the current measurement resistor, the current measurement resistor has reduced power loss. Therefore, according to the present invention, it is possible to measure the amount of the drive current flowing through the power transmission coil with low power loss.

BRIEF DESCRIPTION OF THE DRAWINGS

FIG. 5 is a circuit diagram illustrating an example of an excessive magnetic field protection circuit 231;

FIG. 6 is a graph illustrating a voltage-current characteristic of the excessive magnetic field protection circuit 231;

DETAILED DESCRIPTION OF THE INVENTION

An embodiment of the present invention will be described below in detail with reference to the drawings.

Figure 1:
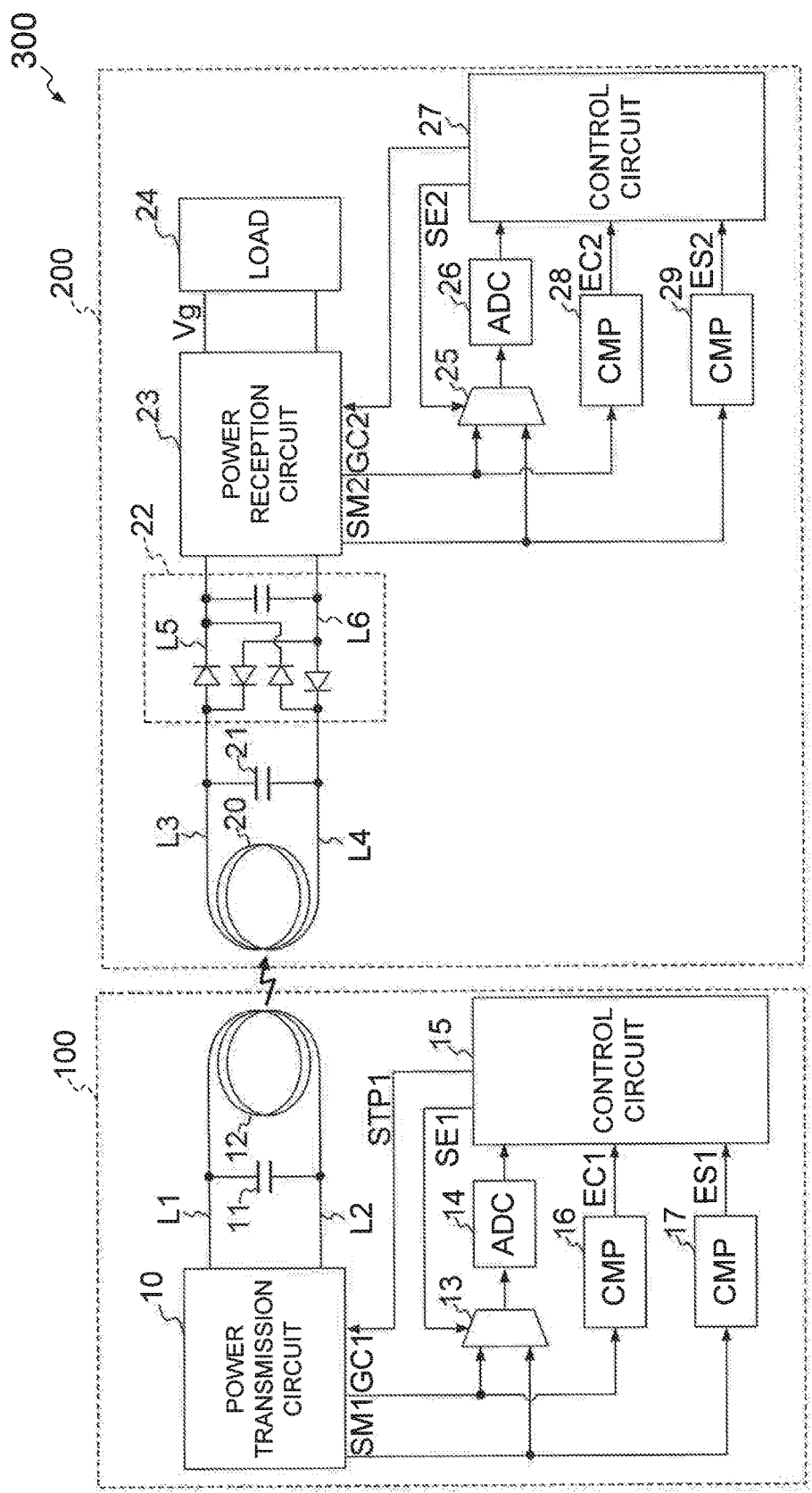
FIG. 1 is a block diagram illustrating a schematic configuration of a wireless power supply system 300 including a wireless power feeding device 100 and a wireless power receiving device 200 according to the present invention.

FIG. 1 is a block diagram illustrating a schematic configuration of a wireless power supply system 300 including a wireless power feeding device 100 and a wireless power receiving device 200 according to the present invention. The wireless power supply system 300 supplies power from the wireless power feeding device 100 to the wireless power receiving device 200 by magnetic coupling between a power transmission coil 12 provided in the wireless power feeding device 100 and a power reception coil 20 provided in the wireless power receiving device 200.

The internal configuration of each of the wireless power feeding device 100 and the wireless power receiving device 200 will be concretely described below in order of the wireless power feeding device 100 and the wireless power receiving device 200.

[Wireless Power Feeding Device 100]

The wireless power feeding device 100 includes a power transmission circuit 10, a resonance capacitor 11, a power transmission coil 12, a selector 13, an AD (analog-to-digital) converter 14, a control circuit 15, and comparators 16 and 17. The power transmission circuit 10, the selector 13, the AD converter 14, the control circuit 15, and the comparators 16 and 17 may be formed, for example, in a single semiconductor IC (integrated circuit) chip, in a plurality of semiconductor IC chips dividedly, or in discrete components.

The power transmission circuit 10 generates a high-frequency alternating driving current the frequency of which is approximately equal to a self-oscillation frequency (for example, 13.56 MHz) of a resonance circuit constituted of the resonance capacitor 11 and the power transmission coil 12 connected in parallel. The power transmission circuit 10 then supplies the alternating driving current to the resonance capacitor 11 and the power transmission coil 12 through drive lines L1 and L2. Upon receiving the alternating driving current, the resonance capacitor 11 and the power transmission coil 12 generate an alternating current magnetic field. When the control circuit 15 issues a power-off signal STP1, the power transmission circuit 10 stops feeding the current to the resonance capacitor 11 and the power transmission coil 12.

The power transmission circuit 10 measures the amount of the alternating driving current, and provides a measured current signal GC1, which represents the measured current amount, to the selector 13 and the comparator 16. Furthermore, the power transmission circuit 10 measures the temperature of a component (described later) contained in itself, and provides a measured temperature signal SM1, which represents the measured temperature, to the selector 13 and the comparator 17.

The selector 13 selects one of the measured current signal GC1 and the measured temperature signal SM1 commanded by a selection signal SE1, and supplies the selected signal to the AD converter 14.

The AD converter 14 converts an analog current value or temperature represented by the measured current signal GC1 or the measured temperature signal SM1 into digital current data or temperature data, and supplies the digital current data or temperature data to the control circuit 15.

The control circuit 15 is constituted of, for example, a microcomputer and the like, and determines an abnormality in current or temperature by control of a program, as described below. To be more specific, when the current data is supplied from the AD converter 14, the control circuit 15 determines whether or not the current amount represented by the current data is higher than a predetermined overcurrent threshold value I1. When the current amount is determined to be higher than the predetermined overcurrent threshold value I1, the control circuit 15 determines the current amount to be overcurrent and issues the power-off signal STP1 to the power transmission circuit 10 to stop power supply. When the temperature data is supplied from the AD converter 14, the control circuit 15 determines whether or not the temperature represented by the temperature data is higher than a predetermined high temperature threshold value T1. When the temperature is determined to be higher than the predetermined high temperature threshold value T1, the control circuit 15 determines the temperature to be abnormal heat generation and issues the power-off signal STP1 to the power transmission circuit 10.

The comparator 16 determines whether or not the current amount represented by the measured current signal GC1 is higher than a predetermined overcurrent threshold value I2 (I1<I2). When the current amount is determined to be higher than the predetermined overcurrent threshold value I2, the comparator 16 issues an overcurrent detection signal EC1 to the control circuit 15. The comparator 17 determines whether or not the temperature represented by the measured temperature signal SM1 is higher than a predetermined high temperature threshold value T2 (T1<T2). When the temperature is determined to be higher than the predetermined high temperature threshold value T2, the comparator 17 issues a high temperature detection signal ES1 to the control circuit 15. When the overcurrent detection signal EC1 or the high temperature detection signal ES1 is supplied, the control circuit 15 issues the power-off signal STP1 to the power transmission circuit 10.

The high temperature threshold value T1 and the overcurrent threshold value I1 are set at a current value and a temperature that are obtained when the control circuit 15 is in a normally operable temperature environment. The high temperature threshold value T2 and the overcurrent threshold value I2 are set at a current value and a temperature that are obtained when the control circuit 15 is in a program runaway temperature environment.

In other words, when the control circuit 15 is in the normally operable temperature environment, the control circuit 15 determines an abnormality in current or temperature. On the other hand, when the control circuit 15 is in the program runaway temperature environment, the comparators 16 and 17 determine an abnormality in current or temperature. Thus, even when the control circuit 15 is in a temperature condition in which the control circuit 15 does not operate normally, it is possible to apply the power-off control to the power transmission circuit 10.

Figure 2:
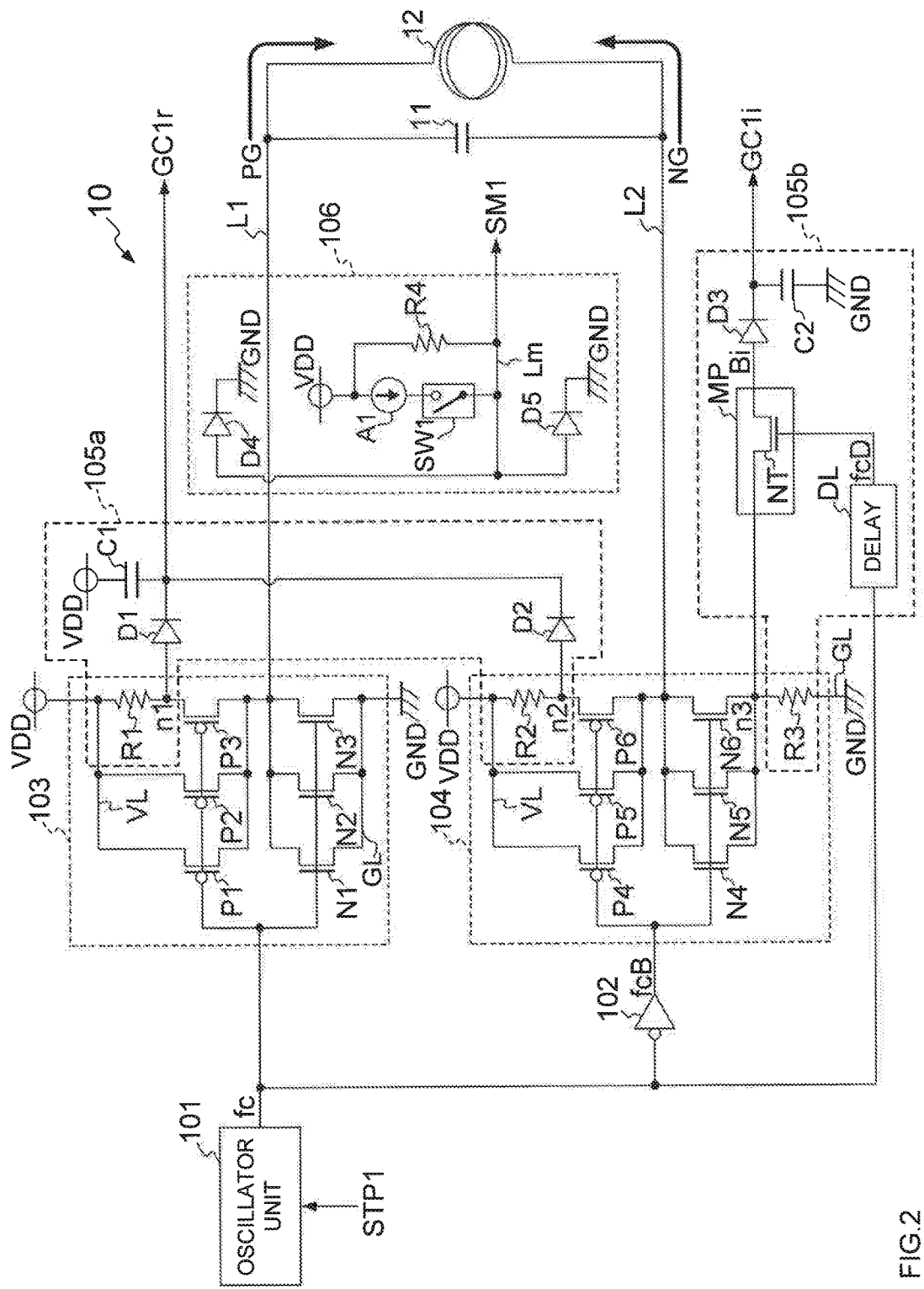
FIG. 2 is a circuit diagram illustrating an example of an internal configuration of a power transmission circuit 10.

FIG. 2 is a circuit diagram illustrating an example of an internal configuration of the power transmission circuit 10. As shown in FIG. 2, the power transmission circuit 10 includes an oscillator unit 101, an inverter 102, output inverters 103 and 104, current measurement circuits 105a and 105b, and a temperature measurement circuit 106.

The oscillator unit 101 generates an oscillation signal fc having the self-oscillation frequency of the resonance circuit (11 and 12), for example, 13.56 MHz, and supplies the oscillation signal fc to the inverter 102, the output inverter 103, and the current measurement circuit 105b. Note that, upon receiving the power-off signal STP1 from the control circuit 15 shown in FIG. 1, the oscillator unit 101 stops generating the oscillation signal fc.

The inverter 102 supplies an inverted oscillation signal fcB into which the phase of the oscillation signal fc is inverted, to the output inverter 104.

In response to the oscillation signal fc, the output inverter 103 generates a drive current PG, and supplies the drive current PG to the drive line L1. In response to the inverted oscillation signal fcB, the output inverter 104 generates a drive current NG, and supplies the drive current NG to the drive line L2. Thus, the output inverters 103 and 104 supply an alternating drive current (PG and NG) to the power transmission coil 12 through the drive lines L1 and L2.

The current measurement circuit 105a measures a real component of the drive currents PG and NG supplied from the output inverters 103 and 104 to the power transmission coil 12 through the drive lines L1 and L2, and generates a measured current signal GC1r representing the real component.

The current measurement circuit 105b measures a complex component of the drive currents PG and NG, and generates a measured current signal GC1i representing the complex component.

The temperature measurement circuit 106 measures the temperature of heat generated by the output inverters 103 and 104, and generates the measured temperature signal SM1 representing the temperature.

The structure of each of the output inverters 103 and 104, the current measurement circuits 105a and 105b, and the temperature measurement circuit 106 will be described below in detail.

The output inverter 103 includes p-channel MOS (metal-oxide-semiconductor) transistors P1 to P3 connected in parallel, n-channel MOS transistors N1 to N3 connected in parallel, and a current measurement resistor R1. The transistors P1 to P3 and N1 to N3 are connected to the drive line L1 at their drains, and are supplied with the oscillation signal fc at their gates. A ground potential GND is applied to sources of the transistors N1 to N3 through a ground line GL. A power potential VDD is applied to sources of the transistors P1 and P2 through a power line VL, and the power potential VDD is applied to a source of the transistor P3 through the power line VL and the resistor R1.

The output inverter 104 includes p-channel MOS transistors P4 to P6 connected in parallel, n-channel MOS transistors N4 to N6 connected in parallel, and current measurement resistors R2 and R3. The transistors P4 to P6 and N4 to N6 are connected to the drive line L2 at their drains, and are supplied with the inverted oscillation signal fcB at their gates. Sources of the transistors N1 to N3 are connected to an end of a resistor R3 through a node n3. The ground potential GND is applied to the other end of the resistor R3 through the ground line GL. The power potential VDD is applied to sources of the transistors P4 and P5 through the power line VL, and the power potential VDD is applied to a source of the transistor P6 through the power line VL and the resistor R2.

The current measurement circuit 105a has the resistor R1 included in the output inverter 103, diodes D1 and D2, and a capacitor C1. An anode of the diode D1 is connected to a node n1 for connecting between the source of the transistor P3 and one end of the resistor R1. An anode of the diode D2 is connected to a node n2 connecting between the source of the transistor P6 and one end of the resistor R2. Cathodes of the diodes D1 and D2 and one end of the capacitor C1 are connected to each other. The power potential VDD is applied to the other end of the capacitor C1.

In the above-described configuration, when the oscillation signal fc is at a lower level than a predetermined value, all of the transistors P1 to P3 of the output inverter 103 are turned on, and all of the transistors N4 to N6 of the output inverter 104 are turned on. Thus, a current is sent out from each of the transistors P1 to P3 of the output inverter 103, and a composite current, which is a composite of the currents, flows into the power transmission coil 12 through the drive line L1 as a drive current PG, as shown by a thick arrow of FIG. 2.

When the transistors P1 to P3 have the same size (gate width and gate length) and the current measurement resistor R1 has a lower resistance than the on-resistance of the transistors P1 to P3, one-third of the drive current PG flows through each of the transistors P1 to P3. Therefore, one-third of the drive current PG also flows through the current measurement resistor R.

Therefore, the current (PG/3) flowing through the resistor R1 is rectified by the diode D1 of the current measurement circuit 105a and is smoothed by the capacitor C1, in order to obtain the measured current signal GC1r having a voltage value corresponding to the real component of the drive current PG.

When the oscillation signal fc is at a higher level than the predetermined value, all of the transistors N1 to N3 of the output inverter 103 are turned on, and all of the transistors P4 to P6 of the output inverter 104 are turned on. Thus, a current is sent out from each of the transistors P4 to P6 of the output inverter 104, and a composite current, which is a composite of the currents, flows into the power transmission coil 12 through the drive line L2 as a drive current NG, as shown by a thick arrow of FIG. 2.

When the transistors P4 to P6 have the same size (gate width and gate length) and the current measurement resistor R2 has a lower resistance than the on-resistance of the transistors P4 to P6, one-third of the drive current NG flows through each of the transistors P4 to P6. Therefore, one-third of the drive current NG also flows through the resistor R2.

Therefore, the current (NG/3) flowing through the resistor R2 is rectified by the diode D2 of the current measurement circuit 105a and is smoothed by the capacitor C1, in order to obtain the measured current signal GC1r having a voltage value corresponding to the real component of the drive current NG.

As described above, the output inverter 103 (104) does not generate a drive current PG (NG) by only a single p-channel transistor, but generates a drive current PG (NG) by combining currents outputted from the three transistors P1 to P3 (P4 to P6) connected in parallel. In the current measurement circuit 105a, the current measurement resistor R1 (R2) is connected to only one of the transistor P3 (P6) of the three transistors P1 to P3 (P4 to P6) in series. The current measurement circuit 105a generates a measured current signal GC1r representing a current amount of one-third of the real component of the drive current PG (NG), by detecting and smoothing a voltage drop of the current measurement resistor. Tripling the current amount represented by the measured current signal GC1r allows obtaining the current amount of the real component of the drive current PG (NG).

According to the output inverter 103 (104) and the current measurement circuit 105a, since only one-third of the drive current PG (NG) flows through the current measurement resistor R1 (R2), power loss at the current measurement resistor R1 (R2) is reduced.

Next, the current measurement circuit 105b shown in FIG. 2 will be described.

The current measurement circuit 105b includes a delay circuit DL, a multiplication circuit MP, a diode D3, and a capacitor C2. The delay circuit DL receives an oscillation signal fc, and supplies the oscillation signal with a definite delay time to the multiplication circuit MP as a delayed oscillation signal fcD. The definite delay time is equal to a total delay time of the component delay of the inverter 102 and the component delay of the output inverter 104. The multiplication circuit MP multiplies the potential of one end of the resistor R3 of the output inverter 104, i.e., the potential of the node n3 shown in the drawing by the delayed oscillation signal fcD, to generate a complex component signal Bi representing the complex component of the drive current PG (NG). To be more specific, the multiplication circuit MP is constituted of an n-channel MOS transistor NT that is connected to the node n3 at its source and is supplied with the delayed oscillation signal fcD at its gate. When the delayed oscillation signal fcD is at a lower level than a predetermined value, the transistor NT is turned off. On the other hand, when the delayed oscillation signal fcD is at a higher level than the predetermined value, the transistor NT is turned on and outputs the potential of the delayed oscillation signal fcD from its drain. The transistor NT makes a potential occurring in the drain of itself as the complex component signal Bi representing the complex component of the drive current PG (NG), and supplies the complex component signal Bi to an anode of the diode D3. A cathode of the diode D3 is connected to one end of the capacitor C2. The other end of the capacitor C2 is supplied with the ground potential GND. Thus, the complex component signal Bi is rectified by the diode D3 and is smoothed by the capacitor C2, in order to obtain the measured current signal GC1i having a voltage value corresponding to the complex component of the drive current PG (NG).

The current measurement circuit 105b can quantitatively measure the complex component of the drive current PG (NG). Thus, it is possible to detect a change of a coupling coefficient between the power transmission coil 12 and the power reception coil 20, a change of a load resistance on the power receiving side, the presence of a foreign object between the power transmission coil 12 and the power reception coil 20, and the like on the basis of a measured current signal GC1r representing the complex component of a drive current PG (NG).

For example, when r1 represents a load resistance on the power receiving side, and k1 represents a coupling coefficient between the power transmission coil 12 and the power reception coil 20 (referred to as a state A), X1 is the level of a measured current signal GCr representing the real component of a drive current, and Y1 is the level of a measured current signal GCi representing the complex component thereof.

When the coupling coefficient changes from k1 in the state A to k2 (referred to as a state B), the level of the measured current signal GCr changes from the level X1 to a level X2, and the level of the measured current signal GCi changes from the level Y1 to a level Y2.

When the load resistance changes from r1 in the state A to r2 (referred to as a state C), the level of the measured current signal GCr changes from the level X1 to the level X2, and the level of the measured current signal GCi changes from the level Y1 to a level Y3. In other words, both of a case where the state A changes to the state B (a state of changing the coupling coefficient) and a case where the state A changes to the state C (a state of changing the load resistance), the level of the measured current signal GCr, which represents the real component of the drive current, may become the level X2. Thus, it is impossible to distinguish between a change of the load resistance and a change of the coupling coefficient on the basis of the measured current signal GCr. However, as described above, the measured current signal GCi has the level Y2 when the state A changes to the state B (a state of changing the coupling coefficient), while the measured current signal GCi has the level Y3, which is different from the level Y2, when the state A changes to the state C (a state of changing the load resistance). Therefore, it is possible to distinguish between a change of the load resistance and a change of the coupling coefficient on the basis of the measured current signal GCi, which represents the complex component of the drive current.

The delayed oscillation signal fc is supplied to the gate of the transistor NT of the multiplication circuit MP in the configuration of the current measurement circuit 105b, as shown in FIG. 2, but the amplitude value of a voltage applied to the power transmission coil 12 may be supplied to the gate of the transistor NT.

Figure 3:
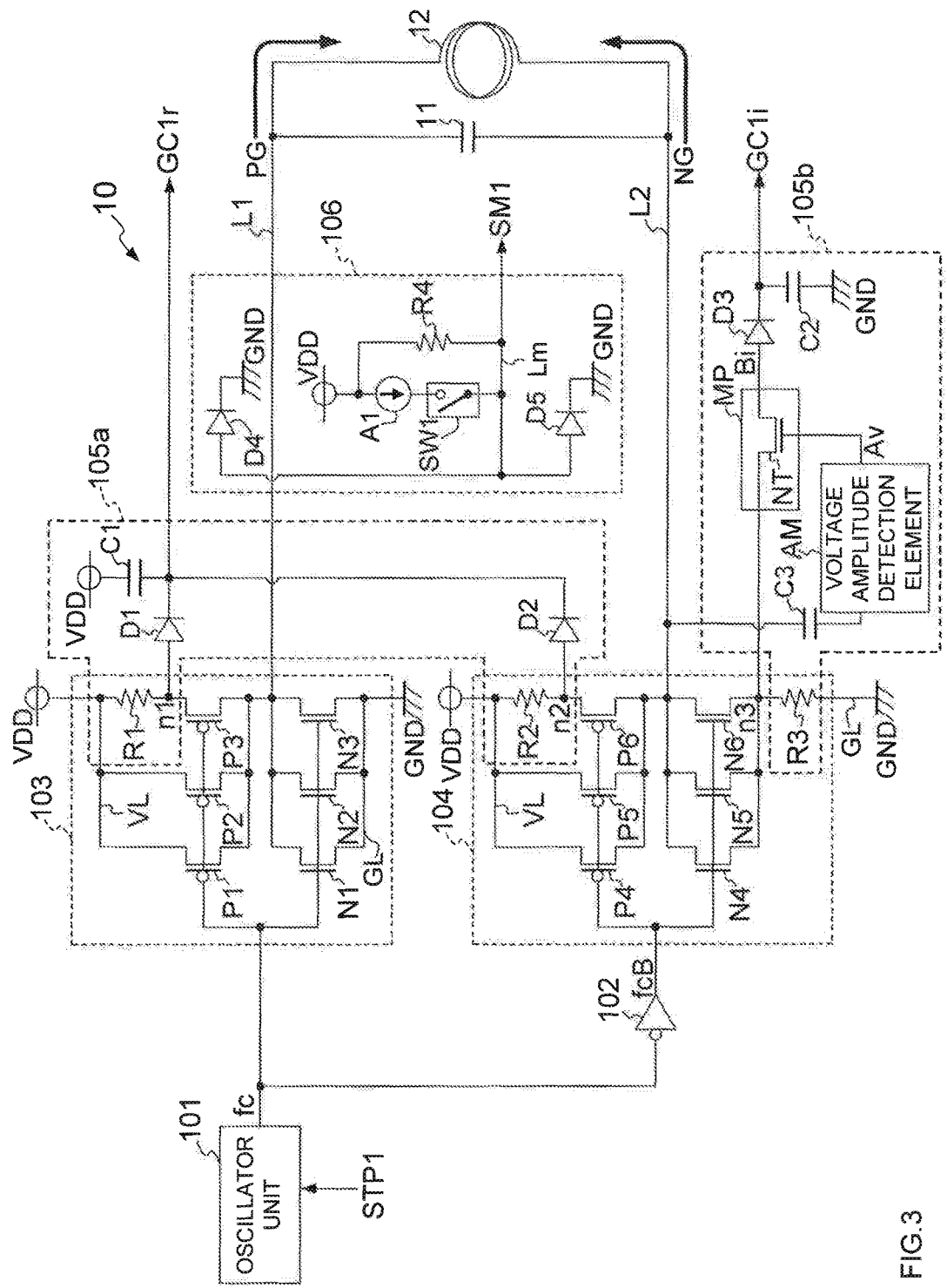
FIG. 3 is a circuit diagram illustrating another example of an internal configuration of a current measurement circuit 105b.

FIG. 3 is a circuit diagram illustrating another example of the internal configuration of the current measurement circuit 105b in consideration of the aforementioned matters. The configuration of FIG. 3, except for the internal configuration of the current measurement circuit 105b, is the same as that of FIG. 2. The configuration of the current measurement circuit 105b shown in FIG. 3 is the same as that of FIG. 2, except that a capacitor C3 and a voltage amplitude detection element AM are used instead of the delay circuit DL shown in FIG. 2. In other words, in the current measurement circuit 105b, as shown in FIG. 3, the voltage amplitude detection element AM receives the voltage of the drive line L2 through the capacitor C3, and the amplitude value of the voltage is supplied to a gate of the transistor NT.

As the concrete configuration of the multiplication circuit MP included in the current measurement circuit 105b, a Gilbert cell may be used, instead of the transistor NT, to combine output currents of the two differential circuits.

Next, the temperature measurement circuit 106 shown in FIGS. 2 and 3 will be described.

The temperature measurement circuit 106 includes a current source A1, a switching element SW1, a resistor R4, and PN junction diodes D4 and D5 as temperature sensors.

The resistor R4 supplies a bias current based on the power potential VDD to anodes of the diodes D4 and D5 through a line Lm.

The diode D4 is formed in the vicinity of the output inverter 103, and is thermally coupled to at least one of the transistors P1 to P3 and N1 to N3. The diode D5 is formed in the vicinity of the output inverter 104, and is thermally coupled to at least one of the transistors P4 to P6 and N4 to N6. When the output inverters 103 and 104 and the temperature measurement circuit 106 are formed in a single semiconductor IC chip, the diode D4 (D5) is formed adjacently to at least one of the transistors P1 to P3 and N1 to N3 (P4 to P6 and N4 to N6). When the output inverters 103 and 104 and the temperature measurement circuit 106 are constituted of discrete components, the diode D4 (D5) may contact at least one of the transistors P1 to P3 and N1 to N3 (P4 to P6 and N4 to N6).

As the PN junction diodes D4 and D5, for example, diodes having a forward voltage of 0.7 volts and a temperature characteristic of −1.5 [mV/° C.] are used. Thus, when a bias current flows into the diodes D4 and D5 through the resistor R4, the voltage of the anodes of the diodes D4 and D5, in other words, the voltage of the line Lm varies in accordance with the temperature of heat generated by at least one of the transistors P1 to P3 and N1 to N3 (P4 to P6 and N4 to N6). The temperature measurement circuit 106 outputs the voltage of the line Lm as the measured temperature signal SM1, which represents a measured temperature. The measured temperature is the temperature of one of the diodes D4 and D5 exposed to a higher temperature. The temperature measurement circuit 106 measures the temperature of one of the output inverters 103 and 104 having a higher heating value, thus being favorable for safety. Since the temperature measurement circuit 106 is electrically insulated from the output inverters (103 and 104), the temperature measurement circuit 106 can operate reliably without being affected by noise owing to the large high-frequency drive currents (PG and NG) flowing through the output inverters.

The temperature measurement circuit 106 is provided with the current source A1 and the switching element SW1, which forms a test circuit for testing whether temperature measurement by itself is normal or abnormal. The current source A1 receives the power potential VDD and generates a test bias current. The switching element SW1 is turned on and off in response to a temperature sensor test signal supplied from the control circuit 15. For example, the control circuit 15 supplies the temperature sensor test signal to the switching element SW1 to keep the switching element SW1 in an off state during normal operation. The control circuit 15 supplies the temperature sensor test signal to the switching element SW1 to make the switching element SW turned on and off when testing the temperature sensor. When the switching element SW1 is turned on, the test bias current generated by the current source A1 is supplied to the anodes of the diodes D4 and D5 through the line Lm. When testing the temperature sensor, the control circuit 15 captures the value of the measured temperature signal SM1 obtained in an on state of the switching element SW1 and the value of the measured temperature signal SM1 obtained in an off state of the switching element SW1, and determines that the temperature sensor operates normally when the values do not coincide, while determines that the temperature sensor operates abnormally when the values coincide. Therefore, the test circuit (A1 and SW1) can determine normality of the temperature measurement circuit, without changing an ambient temperature.

On the basis of the measured temperature signal SM1, the voltage and current applied to the transistors (P1 to P6 and N1 to N6) can be estimated. Thus, power loss of the wireless power feeding device 100 can be obtained on the basis of the measured temperature signal SM1. When the power loss is estimated on the basis of the measured temperature signal SM1 to be lower than a predetermined level, the control circuit 15 determines that power supply is performed favorably. On the other hand, when the power loss is estimated to be higher than the predetermined level, the control circuit 15 determines that power supply has reduced efficiency, and may apply control such as matching change to the power transmission circuit 10. Furthermore, when the power loss is estimated on the basis of the measured temperature signal SM1 to be excessive, the control circuit 15 supplies the power-off signal STP1 to the power transmission circuit 10 for safety's sake. Therefore, it is possible to perform a protection operation, for example, forcefully stopping the operation of the power transmission circuit 10.

Accordingly, providing the temperature measurement circuit 106 increases the efficiency of the wireless power feeding device 100 while saving power, and secures the safety of the operation of the wireless power feeding device 100.

In the temperature measurement circuit 106, the PN junction diodes D4 and D5 are provided in the vicinity of the output inverters 103 and 104, respectively, as temperature sensors, but the temperature sensor may be provided in the vicinity of only one of the output inverters 103 and 104. Alternatively, two or more diodes may be provided in the vicinity of each of the output inverters 103 and 104. Thermistor circuits for measuring the temperature of a secondary battery may be used instead of the PN junction diodes.

In each of the output inverters 103 and 104 shown in FIG. 2, the three p-channel MOS transistors are connected in parallel, but the number of transistors connected in parallel is not limited to three. In other words, an N (N is an integer of 2 or more) number of p-channel MOS transistors connected in parallel may be used as p-channel transistors of each of the output inverters 103 and 104. Each p-channel MOS transistor may have a size (gate width and gate length) of an integral ratio of 1:N, or not an integral ratio. When Itx (A) represents a drive current supplied to the power transmission coil 12, and Rmeas (Ω) represents the resistance of each of the current measurement resistors R1 and R2, the voltage Vdet (V) of the measured current signal GC1$r$ is represented as follows:

$$Vdet=Itx*(1/N)*Rmeas$$

When the size (gate width and gate length) of each transistor is multiplied by M (M is a real number), the voltage Vdet (V) of the measured current signal GC1$r$ is represented as follows:

$$Vdet=Itx*[1/(N*M)]*Rmeas$$

When the size of each of the p-channel transistors constituting the output inverters 103 and 104 is multiplied by M, the drive current is multiplied by approximately M. However, according to the configuration of the output inverter 103 (104) and the current measurement circuit 105$a$, the voltage Vdet itself of the measured current signal GC1$r$ does not change significantly. Therefore, it is possible to prevent a situation in which the current measurement circuit 105$a$ deviates from its operation range, or contrarily, resolution is reduced owing to a too low level, thus obtaining optimal measurement precision.

In other words, the wireless power feeding device (100) for wireless power supply using an alternating current magnetic field generated by supplying an alternating drive current (NG or PG) to the power transmission coil (12) need to include at least the following first to Nth switching elements, current measurement resistor, and current measurement circuit. The first to Nth switching elements (for example, P1 to P3 or P4 to P6) are connected in parallel between a drive line (L1 or L2) connected to one end of a power transmission coil and the power line (VL). Each of the first to Nth switching elements independently supplies a current to a drive line in response to an oscillation signal (fc or fcB). The current measurement resistor (R1 or R2) is connected in series with a first switching element (P3 or P6) between the power line and the drive line. The current measurement circuit (105$a$) generates a measured current signal (GC1$r$) representing the amount of a drive current, on the basis of the potential of one end of the resistor (R1 or R2).

Therefore, since only one-Nth of the drive current flows through the current measurement resistor, the power loss at the current measurement resistor is reduced.

[Wireless Power Receiving Device 200]

Next, the configuration of the wireless power receiving device 200, as shown in FIG. 1, will be described.

The wireless power receiving device 200 includes a power reception coil 20, a resonance capacitor 21, a rectifier circuit 22, a power reception circuit 23, a load circuit 24, a selector 25, an AD converter 26, a control circuit 27, and comparators 28 and 29. The power reception circuit 23, the selector 25, the AD converter 26, the control circuit 27, and the comparators 28 and 29 may be formed, for example, in a single semiconductor IC chip, in a plurality of semiconductor IC chips dividedly, or in discrete components.

The power reception coil 20 and the resonance capacitor 21 are magnetically coupled to an alternating current magnetic field generated by the power transmission coil 12, and apply an alternating current voltage having a voltage value corresponding to the alternating current magnetic field to lines L3 and L4.

As shown in FIG. 1, for example, the rectifier circuit 22 includes a diode bridge in which four rectifying diodes are connected and a smoothing capacitor. The rectifier circuit 22 full-wave rectifies and smooths an alternating current voltage between the drive lines L3 and L4 into a direct current voltage (hereinafter referred to as received supply voltage), and supplies the received supply voltage to the power reception circuit 23 through lines L5 and L6.

The power reception circuit 23 generates a voltage of a predetermined level at which the voltage value of the received supply voltage between the lines L5 and L6 is fixed, as an output voltage Vg, and supplies the output voltage Vg to the load circuit 24. The load circuit 24 is, for example, a battery charging circuit for charging a secondary battery, or a power circuit for various electronic devices such as IC cards.

Furthermore, the power reception circuit 23 performs various operations including measurement of the strength of the alternating current magnetic field generated by the wireless power feeding device 100, protection from an excessive alternating current magnetic field, measurement of the voltage value of the received supply voltage, measurement of a current and a voltage supplied to the load circuit 24, measurement of the temperature of heat generated by the power reception circuit 23, protection from an excessive voltage, and the like. The power reception circuit 23 supplies, for example, a measured current signal GC2 representing a measured current amount to the selector 25 and the comparator 28. The power reception circuit 23 supplies a measured temperature signal SM2 representing a measured temperature to the selector 25 and the comparator 29.

The selector 25 selects one of the measured current signal GC2 and the measured temperature signal SM2 commanded by a selection signal SE2, and supplies the selected one to the AD converter 26.

The AD converter 26 converts the analog current value or temperature represented by the measured current signal GC2 or the measured temperature signal SM2 into digital current data or temperature data, and supplies the digital current data or temperature data to the control circuit 27.

The control circuit 27 is constituted of, for example, a microcomputer and the like, and determines an abnormality in current or temperature by control of a program, as described below. To be more specific, when the current data is supplied from the AD converter 26, the control circuit 27 determines whether or not the current amount represented by the current data is higher than a predetermined overcurrent threshold value I1. When the current amount is determined to be higher than the predetermined overcurrent threshold value I1, the control circuit 27 determines the current amount to be overcurrent, and controls (power-off control) the power reception circuit 23 to stop supplying a power voltage to the load circuit 24. When the temperature data is supplied from the AD converter 26, the control circuit 27 determines whether or not the temperature represented by the temperature data is higher than a predetermined high temperature threshold value T1. When the temperature is determined to be higher than the predetermined high temperature threshold value T1, the control circuit 27 determines the temperature to be abnormal heat generation, and applies the above-described power-off control to the power reception circuit 23. The control circuit 27 supplies the power reception circuit 23 with a control signal to determine the operation of the power reception circuit 23 (described later), on the basis of the temperature data or the current data supplied from the AD converter 26.

The comparator 28 determines whether or not the current amount represented by the measured current signal GC2 is higher than a predetermined overcurrent threshold value I2 (I1<I2). When the current amount is determined to be higher than the predetermined overcurrent threshold value I2, the comparator 28 issues an overcurrent detection signal EC2 to the control circuit 27. The comparator 29 determines whether or not the temperature represented by the measured temperature signal SM2 is higher than a predetermined high temperature threshold value T2 (T1<T2). When the temperature is determined to be higher than the predetermined high temperature threshold value T2, the comparator 29 issues a high temperature detection signal ES2 to the control circuit 27. When the overcurrent detection signal EC2 or the high temperature detection signal ES2 is supplied, the control circuit 27 applies the above-described power-off operation to the power reception circuit 23.

The high temperature threshold value T1 and the overcurrent threshold value I1 are set at a current value and a temperature that are obtained when the control circuit 27 is in a normally operable temperature environment. The high temperature threshold value T2 and the overcurrent threshold value I2 are set at a current value and a temperature that are obtained when the control circuit 27 is in a program runaway temperature environment.

In other words, when the control circuit 27 is in the normally operable temperature environment, the control circuit 27 determines an abnormality in current or temperature. On the other hand, when the control circuit 27 is in the program runaway temperature environment, the comparators 28 and 29 determine an abnormality in current or temperature. Thus, even when the control circuit 27 is in a temperature condition in which the control circuit 27 does not operate normally, it is possible to apply the power-off control to the power reception circuit 23.

Figure 4:
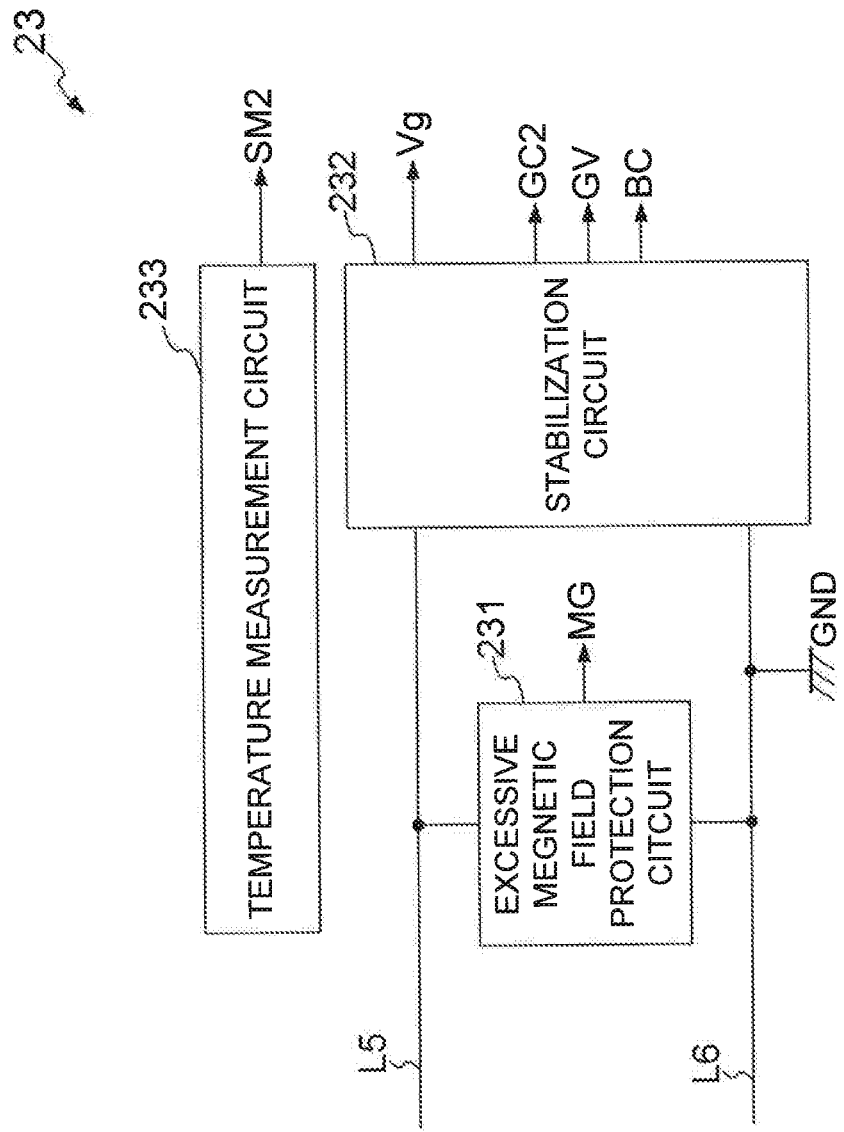
FIG. 4 is a block diagram of an internal configuration of a power reception circuit 23.

FIG. 4 is a block diagram of the internal configuration of the power reception circuit 23. As shown in FIG. 4, the power reception circuit 23 includes an excessive magnetic field protection circuit 231 and a stabilization circuit 232 to which the voltage between the lines L5 and L6 is applied, and a temperature measurement circuit 233. The line L6 is the so-called ground line to which the ground potential GND is applied.

FIG. 5 is a circuit diagram of an example of the excessive magnetic field protection circuit 231. In FIG. 5, a Zener diode ZD is connected to the line L5 at its cathode, and is connected to the line L6 at its anode. Resistors R5 and R6, as voltage dividing resistors, are connected in parallel with the Zener diode ZD. In the configuration of FIG. 5, the excessive magnetic field protection circuit 231 outputs a divided voltage obtained by dividing the voltage between the lines L5 and L6 by the resistors R5 and R6 as a magnetic field strength signal MG, which represents the strength of the alternating current magnetic field generated by the power transmission coil 12 of the power transmission circuit 10.

FIG. 6 is a graph illustrating the characteristic of a current flowing between the cathode and anode of the Zener diode ZD, relative to the received supply voltage supplied through the line L5. As shown in FIG. 6, when the received supply voltage is lower than a Zener voltage Vz of the Zener diode ZD, a current hardly flows through the Zener diode ZD. In other words, a load impedance is high with respect to the resonance circuit (20 and 21) on the power receiving side. Thus, the received supply voltage is supplied to the stabilization circuit 232 in the next stage through the line L5. When the received supply voltage exceeds the breakdown voltage Vz, a current flows through the Zener diode ZD, and the load impedance drops sharply. At this time, the voltage value of the line L5 becomes equal to the breakdown voltage Vz of the Zener diode ZD, and the received supply voltage the voltage value of which is fixed at the breakdown voltage Vz is supplied to the stabilization circuit 232 through the line L5. In other words, when the received supply voltage becomes overvoltage because the strength of the alternating current magnetic field generated by the power transmission coil 12 is higher than the predetermined level, the Zener diode ZD protects the stabilization circuit 232 from the overvoltage by forcefully fixing the voltage value of the received supply voltage at the breakdown voltage Vz.

When the strength of the alternating current magnetic field generated by the power transmission coil 12 is higher than the predetermined level, the excessive magnetic field protection circuit 231 reduces the load impedance, as described above. Therefore, the resonance circuit (11 and 12) of the wireless power feeding device 100 has the increased impedance, and the alternating current magnetic field generated by the power transmission coil 12 has the reduced strength.

For example, in the case of
the frequency of the oscillation signal fc: 13.56 MHz
the inductance of the power transmission coil 12: 1 µH
the resistance of the power transmission coil 12: 1 Ω
the capacitance of the resonance capacitor 11: 137 pF
the inductance of the power reception coil 20: 1 µH
the resistance of the power reception coil 20: 1 Ω
the capacitance of the resonance capacitor 21: 137 pF
the output voltage of the drive circuit (103 and 104): 3.5 Vrms
the resistance of the drive circuits (103 and 104): 10Ω
a coupling coefficient between the power transmission coil 12 and the power reception coil 20: k=0.1
a load impedance: RL Ω,
on a condition 1 (k=0.1 and RL=1000Ω), the absolute value of an impedance at the drive point on the side of the wireless power feeding device 100 is 749.8Ω.

On a condition 2 (k=0.1 and RL=200Ω), the absolute value of an impedance at the drive point on the side of the wireless power feeding device 100 is 2250Ω.

In other words, when the transmission power of the wireless power feeding device 100 is low, the voltage between the lines L5 and L6 is low. Thus, on the above-described condition 1, the absolute value of the impedance at the drive point on the side of the wireless power feeding device 100 is 749.8Ω. On the other hand, when the transmission power increases, and the voltage between the lines L5 and L6 accordingly increases and its voltage value exceeds the breakdown voltage Vz in the excessive magnetic field protection circuit 231, as well as on the above-described condition 2, the absolute value of the impedance at the drive point on the side of the wireless power feeding device 100 increases to 2250Ω. Thus, since the transmission power of the wireless power feeding device 100 is prevented from increasing, the reception power of the wireless power receiving device 200 is prevented from increasing. Therefore, it is possible to prevent excessive input and ensure safety operation.

Figure 7:
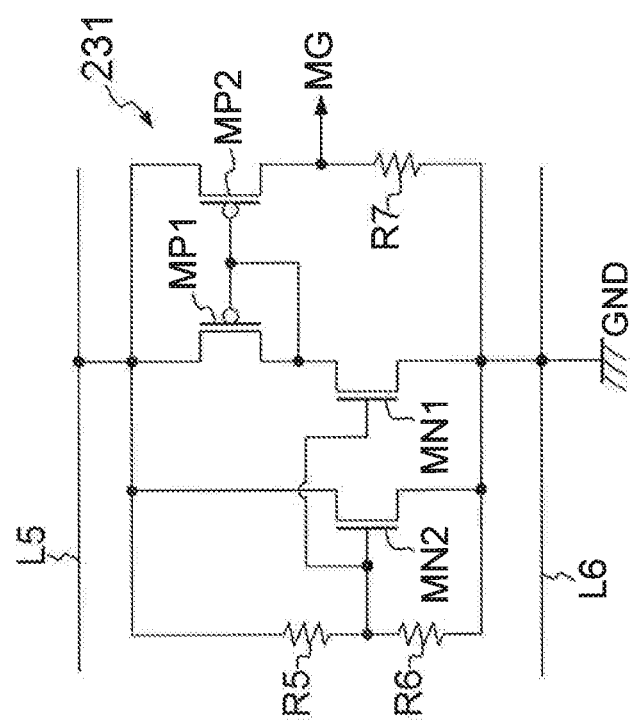
FIG. 7 is a circuit diagram illustrating another example of the excessive magnetic field protection circuit 231.

Note that, as the excessive magnetic field protection circuit 231, the configuration of FIG. 7 may be used instead of the configuration of FIG. 5.

In the configuration of FIG. 7, the excessive magnetic field protection circuit 231 includes n-channel MOS transistors MN1 and MN2 constituting a first current mirror circuit, p-channel MOS transistors MP1 and MP2 constituting a second current mirror circuit, resistors R5 and R6 functioning as voltage dividing resistors, and a resistor R7 for converting a current into a voltage. The resistors R5 and R6, which function as voltage dividing resistors, are connected between the lines L5 and L6, as with the configuration of FIG. 5. A divided voltage into which the voltage between the lines L5 and L6 is divided by the resistors R5 and R6 is supplied to the gates of the transistors MN1 and MN2, which constitute the first current mirror circuit. The transistor MN1 is, for example, one-hundredth the size (gate width and gate length) of the transistor MN2. Thus, when a current corresponding to the divided voltage flows through the transistor MN2, a current of one-hundredth of the current of the transistor MN2 flows through the transistor MN1, and flows through the transistor MP1 on the input side of the second current mirror circuit. Thus, the current that is equal to the current of the transistor MP1 flows through the transistor MP2, and the resistor R7 converts the current into a voltage. The voltage is outputted as the magnetic field strength signal MG.

Note that, in the configuration of FIG. 7, a voltage V corresponding to the breakdown voltage Vz to realize the nonlinear characteristic shown in FIG. 6 is represented as follows:

$$V=Vth*(R5+R6)/R6$$

Vth: the threshold voltage of the transistors MN1 and MN2

As described above, the excessive magnetic field protection circuit 231 provided in the preceding stage of the stabilization circuit 232 detects the strength (transmission power) of an alternating current magnetic field generated by the power transmission coil 12 of the wireless power feeding device 100, and generates the magnetic field strength signal MG representing the strength. Since the magnetic field strength signal MG is captured by the control circuit (27) through the comparator (28 or 29) or the AD converter (26), as shown in FIG. 1, the control circuit (27) can control various operations on the basis of the strength of the alternating current magnetic field. When the power reception coil 20 receives an alternating current magnetic field having a higher strength than a predetermined level, the excessive magnetic field protection circuit 231 fixes the voltage between the lines L5 and L6 at a constant level (Vz), in order to protect the stabilization circuit 232 on the next stage from an excessive voltage. Furthermore, when the power reception coil 20 receives an alternating current magnetic field having a higher strength than the predetermined level, the excessive magnetic field protection circuit 231 reduces a load impedance to increase the impedance of the resonance circuit (11 and 12) of the wireless power feeding device 100. Therefore, the excessive magnetic field protection circuit 231 can prevent power loss in the stabilization circuit 232 and cut waste power transmission from the wireless power feeding device 100 in order to achieve power saving, as well as can prevent excessive input in order to ensure safety in operation.

Figure 8:
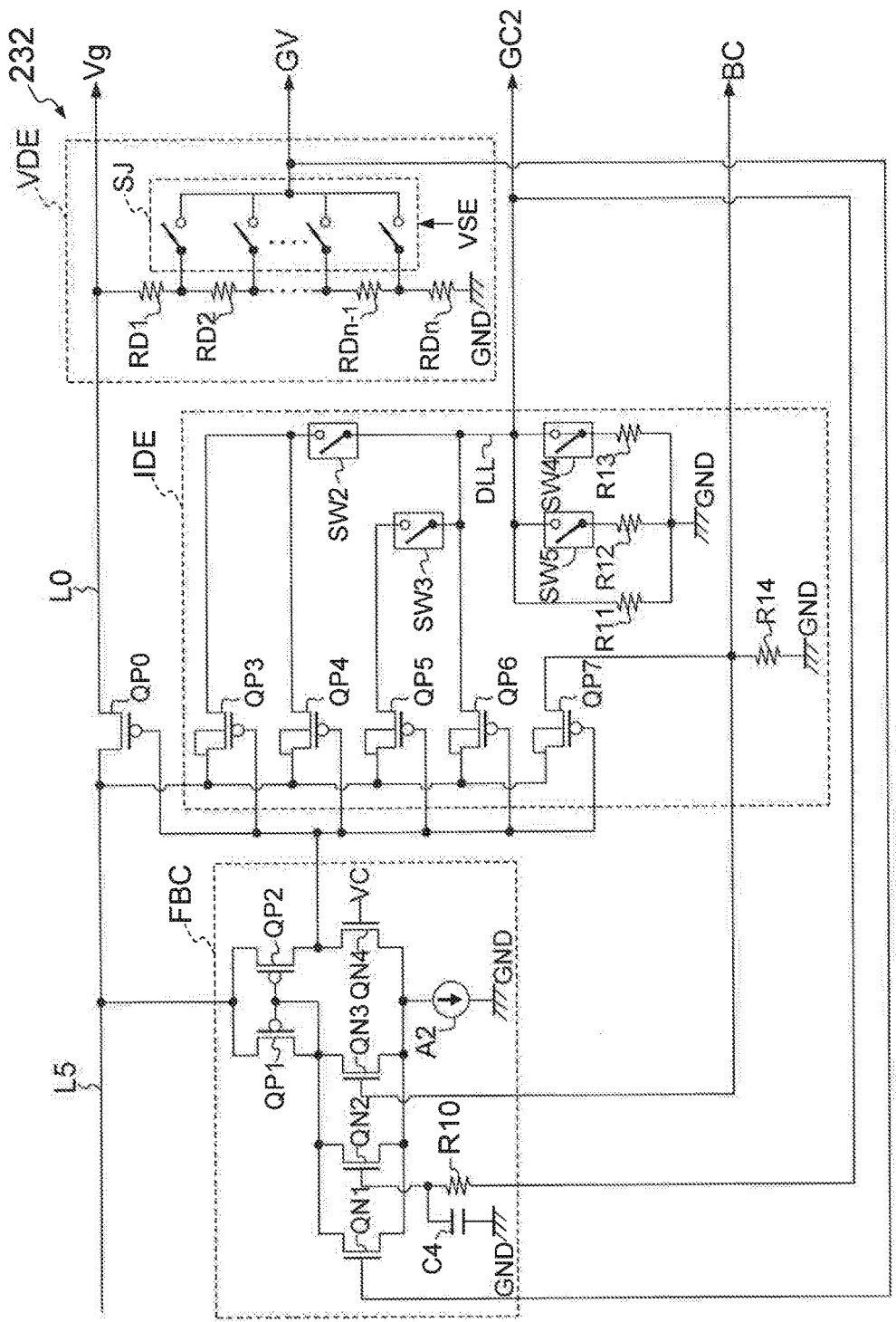
FIG. 8 is a circuit diagram illustrating a configuration of a stabilization circuit 232.

FIG. 8 is a circuit diagram illustrating the configuration of the stabilization circuit 232. The stabilization circuit 232 generates an output voltage Vg having a predetermined constant voltage value on the basis of a received supply voltage supplied through the lines L5 and L6, and supplies the output voltage Vg to the load circuit 24.

As shown in FIG. 8, the stabilization circuit 232 has an output voltage adjustment p-channel MOS transistor QP0, a negative feedback control unit FBC, an output current detection unit IDE, and an output voltage detection unit VDE.

The transistor QP0 adjusts the voltage value of the received supply voltage supplied through the line L5 in accordance with a voltage supped to the gate of itself, and supplies the adjusted voltage to the load circuit 24 through a line L0 as an output voltage Vg.

The output voltage detection unit VDE includes ladder resistors for dividing the voltage value of the line L0, i.e., the voltage value of the output voltage Vg using resistors RD1 to RDn (n is an integer of 2 or more) connected in series, and a voltage dividing ratio setting switch SJ for changing the voltage dividing ratio of the ladder resistors. The voltage dividing ratio setting switch SJ receives a voltage dividing ratio setting signal VSE for specifying the voltage dividing ratio, and selects a voltage of a connection point that corresponds to the voltage dividing ratio indicated by the voltage dividing ratio setting signal VSE, out of connection points between the resistors RD1 to RDn, to generate a measured voltage signal GV having the voltage.

The output current detection unit IDE includes p-channel MOS transistors QP3 to QP7, switching elements SW2 to SW5, and resistors R11 to R14. The gates of the transistors QP3 to QP7 are supplied with a feedback voltage FV generated by the negative feedback control unit FBC. The sources of the transistors QP3 to QP7 are connected to the line L5.

Each of the transistors QP3 to QP6 outputs a current corresponding to the feedback voltage FV supplied to its gate. In other words, the transistors QP3 to QP5 divide the output current flowing through the line L5. Currents outputted from the transistors QP3 and QP4 are combined, and sent out to a detected current line DLL through the switching element SW2. A current outputted from the transistor QP5 is sent out to the detected current line DLL through the switching element SW3. A current outputted from the transistor QP6 is sent out directly to the detected current line DLL. Therefore, for example, when only the switching element SW2 of the switching elements SW2 and SW3 is turned on, a composite current into which the currents outputted from the transistors QP3, QP4, and QP6 are combined is sent out to the detected current line DLL. When both of the switching elements SW2 and SW3 are turned off, only the current outputted from the transistor QP6 is sent out to the detected current line DLL. In other words, the output current detection unit IDE can change the amount of a current to be sent out to the detected current line DLL by turning on and off the switching elements SW2 and SW3 under the control of, for example, the control circuit 27.

Resistors R11 to R13 and switching elements SW4 and SW5 are provided as a current voltage conversion circuit, between the line L6, i.e., the ground line and the detected current line DLL. The ground potential GND is applied to one end of each of the resistors R11 to R13 through the line L6. The other end of the resistor R11 is connected to the detected current line DLL. The other end of the resistor R12 is connected to the detected current line DLL through the switching element SW5. The other end of the resistor R13 is connected to the detected current line DLL through the switching element SW4. In the current voltage conversion circuit, when both of the switching elements SW4 and SW5 are turned off, a current sent out to the detected current line DLL is converted into a voltage value corresponding to the resistance of the resistor R11. When both of the switching elements SW4 and SW5 are turned on, a current sent out to the detected current line DLL is converted into a voltage value corresponding to the composite resistance of the resistors R11 to R13. When only the switching element SW4 of the switching elements SW4 and SW5 is turned on, a current sent out to the detected current line DLL is converted into a voltage value corresponding to the composite resistance of the resistors R11 and R13. In other words, the current voltage conversion circuit (R11 to R13, SW4, and SW5) converts the amount of an output current into a voltage value, and generates the measured current signal GC2 having the voltage value. The current voltage conversion circuit can change the voltage value of the measured current signal GC2 by turning on and off the switching elements SW4 and SW5 under the control of, for example, the control circuit 27.

The transistor QP7 supplies a current that is supplied to its gate and corresponds to the feedback voltage FV to one end of a resistor R14. The other end of the resistor R14 is supplied with the ground potential GND through the line L6. Thus, a voltage that is determined on the basis of the resistance of the resistor R14 and the current sent out from the transistor QP7 occurs at the end of the resistor R14. The resistance of the resistor R14 is set such that the end of the resistor R14 has a voltage above a predetermined level, when the output current is higher than a predetermined current value, i.e., in an overcurrent state. The output current detection unit IDE outputs the voltage at the one end of the resistor R14 as an overcurrent detection signal BC.

The negative feedback control unit FBC includes p-channel MOS transistors QP1 and QP2, n-channel MOS transistors QN1 to QN4, a current source A2, a resistor R10 functioning as a loop filter, and a capacitor C4. The transistors QP1 and QP2 constitute a current mirror circuit that operates in response to the received supply voltage supplied through the line L5. The drain of each of the transistors QN1 to QN3 is connected to the gate and drain of the transistor QP1. The source of each of the transistors QN1 to QN3 is connected to the current source A2. The gate of the transistor QN1 is supplied with the measured voltage signal GV. The gate of the transistor QN3 is supplied with the overcurrent detection signal BC. The gate of the transistor QN2 is supplied with the measured current signal GC2 through the loop filter (C4 and R10). The source of the transistor QN4 is connected to the current source A2. The gate of the transistor QN4 is supplied with a reference potential VC. The drain of the transistor QN4 is connected to the drain of the transistor QP2, and the voltage of a connection point therebetween is generated as a feedback voltage FV.

According to this configuration, the negative feedback control unit FBC calculates the difference between the potential of one of the measured voltage signal GV, the measured current signal GC2, and the overcurrent detection signal BC having the highest strength and the predetermined reference potential VC. The negative feedback control unit FBC applies a voltage representing the voltage difference as the feedback voltage FV to the gates of the transistors QP0 and QP3 to QP7.

Therefore, as shown in FIG. 8, the stabilization circuit 232 adjusts the voltage value of the received supply voltage using the transistor QP0, so as to make one of the measured voltage signal GV, the measured current signal GC2, and the overcurrent detection signal BC having the highest strength equal to the predetermined reference potential VC, and supplies the adjusted voltage as the output voltage Vg.

Therefore, for example, when no load or a load of high resistance is applied, both of the measured current signal GC2 and the overcurrent detection signal BC have low voltages, and hence the measured voltage signal GV has the highest voltage. In this case, the transistor QP0 of the stabilization circuit 232 adjusts the voltage so as to make the level of the measured voltage signal GV equal to the reference potential VC, and as a result, the output voltage Vg is maintained at the constant voltage value. For example, when the load resistance is reduced and an output current is increased, the measured current signal GC2 has the highest voltage. Thus, the transistor QP0 of the stabilization circuit 232 adjusts the voltage so as to make the level of the measured voltage signal GC2 equal to the reference potential VC, and as a result, the output voltage Vg is maintained at the constant voltage value. When a large current flows owing to a short circuit in the load or the like, not only the measured current signal GC2 but also the overcurrent detection signal BC has an increased voltage value. In this case, the voltage is adjusted so as to make the level of the overcurrent detection signal BC equal to the reference potential VC, and as a result, an overcurrent is prevented.

In the configuration of FIG. 8, the levels of the measured current signal GC2 and the measured voltage signal GV can be changed by turning on and off the switches (SJ and SW2 to SW5). Thus, it is possible to change voltage and current measurement ranges at the same time.

Wireless power supply requires stability in voltage and current so as to follow variations in a magnetic field strength, and also requires measurement of a voltage and a current to be supplied to various loads such as a secondary battery. In the stabilization circuit, as shown in FIG. 8, since the output voltage detection unit VDE for voltage measurement and the output current detection unit IDE for current measurement double as a circuit that is originally provided to generate a negative feedback signal for a stabilization circuit, it is possible to save power consumption and reduce the circuit size.

In the stabilization circuit 232 of FIG. 8, when changing or setting the level of a measurement voltage or a measurement current, the measurement range thereof is changed in accordance therewith, and therefore the measurement range, resolution, and measurement precision can be maintained at desired values.

Furthermore, since the stabilization circuit 232 is provided with the overcurrent detection unit (QP7 and R14), and the overcurrent detection signal BC generated in the overcurrent detection unit is added to a negative feedback control path to adjust the output voltage, it is possible to quickly perform adjustment for safety in case of abnormality such as an overcurrent. In the example shown in FIG. 8, a time constant circuit constituted of the loop filter (C4 and R10) is provided for safety in the measurement current feedback path. Generally, in such a time constant circuit, when a sudden short circuit occurs, the delay becomes a problem. However, in the configuration of FIG. 8, the overcurrent detection feedback path (having no loop filter) provided separately from the measurement current feedback path serves to perform quick current control that follows the sudden short circuit or the like.

As described above in detail, the wireless power receiving device 200 applies a received supply voltage obtained after rectification to the excessive magnetic field protection circuit 231 and the stabilization circuit 232 shown in FIG. 4, and thereafter supplies an output voltage Vg corresponding to the received supply voltage to the load circuit 24. For example, the control circuit 27 calculates input power on the basis of the magnetic field strength signal MG generated by the excessive magnetic field protection circuit 231, and calculates output power on the basis of the measured current signal GC2 and the measured voltage signal GV measured by the stabilization circuit 232. Calculating the difference between the input power and the output power obtains redundant power. Thus, performing power save control of the wireless power feeding device 100 with the use of information on the redundant power allows power saving of the whole system.

In other words, as the wireless power receiving device (200) that receives a rectified voltage of an alternating current voltage obtained by the power reception coil (20) in an alternating current magnetic field as a received supply voltage, and generates an output voltage (Vg) having a predetermined voltage value on the basis of the received supply voltage, the wireless power receiving device (200) is required to includes at least the following excessive magnetic field protection circuit and stabilization circuit. The excessive magnetic field protection circuit (231) generates a magnetic field strength signal (MG) representing the strength of an alternating current magnetic field on the basis of a received supply voltage received by a first line (L5), and fixes the voltage value between the first line and the ground line at a predetermined voltage (Vz) when the strength of the alternating current magnetic field is higher than a predetermined level. The stabilization circuit (232) includes the following current detection unit, overcurrent detection unit, voltage detection unit, and voltage adjustment unit. The current detection unit (IDE) measures the amount of a current flowing through the first line, and generates a measured current signal (GC2) representing the current amount. The overcurrent detection unit (QP7 and R14) detects an overcurrent flowing through the first line, and generates an overcurrent detection signal (BC) representing the overcurrent. The voltage detection unit (VDE) measures the voltage value of an output voltage (Vg), and generates a measured voltage signal (GV) representing the voltage value. The voltage adjustment unit (FBC and QP0) adjusts the voltage value of the first line on the basis of the difference between the potential of one having the highest strength among the measured current signal, the overcurrent detection signal, and the measured voltage signal and a reference potential (VC), and outputs the adjusted voltage as an output voltage (Vg).

Figure 9:
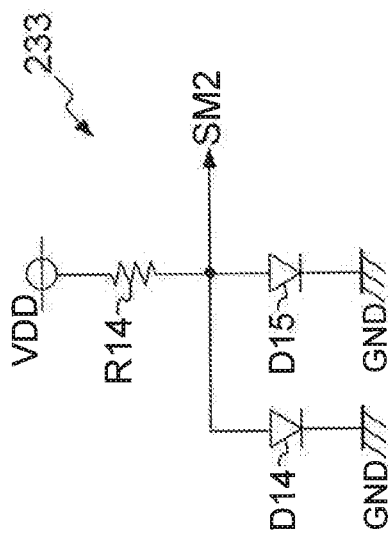
FIG. 9 is a circuit diagram illustrating a configuration of a temperature measurement circuit 233.

Next, the temperature measurement circuit 233 shown in FIG. 4 will be described. FIG. 9 is a circuit diagram illustrating the configuration of the temperature measurement circuit 233.

As shown in FIG. 9, the temperature measurement circuit 233 includes a resistor R14 and PN junction diodes D14 and D15 as temperature sensors.

Figure 10:
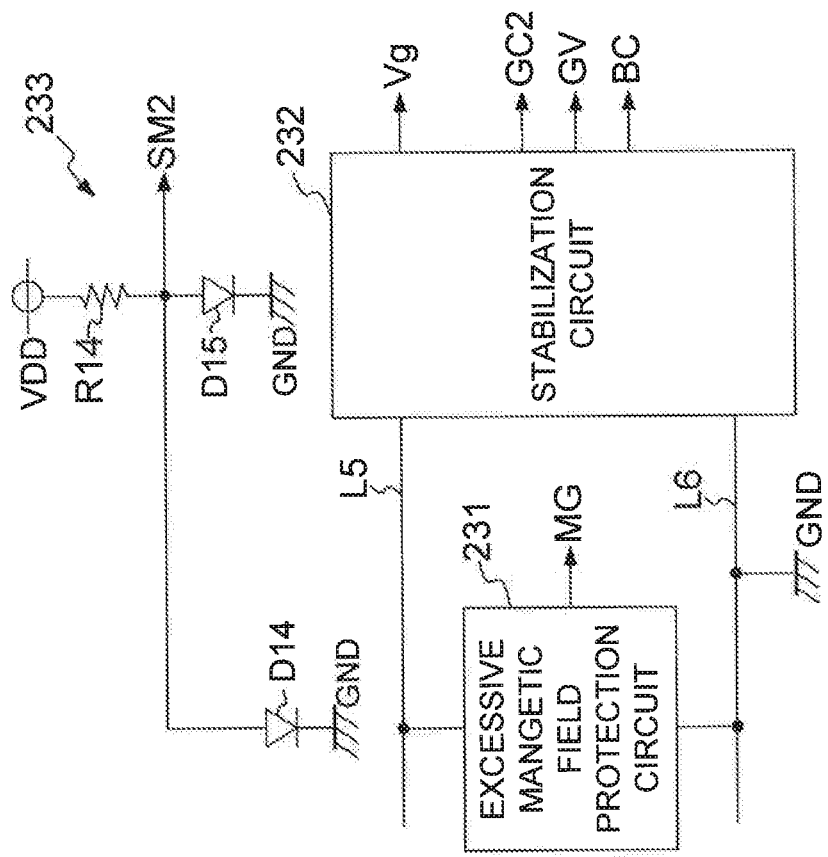
FIG. 10 is a drawing illustrating the formation positions of diodes D14 and D15 of the temperature measurement circuit 233.

The resistor R14 supplies a bias current based on the power potential VDD to the anodes of the diodes D14 and D15. For example, as shown in FIG. 10, the diode D14 is formed in the vicinity of the excessive magnetic field protection circuit 231 so as to be thermally coupled to at least one of the elements constituting the excessive magnetic field protection circuit 231. For example, as shown in FIG. 10, the diode D15 is formed in the vicinity of the stabilization circuit 232 so as to be thermally coupled to at least one of the elements constituting the stabilization circuit 232. In other words, when the excessive magnetic field protection circuit 231 and the stabilization circuit 232 are formed in a single semiconductor IC chip, the diode D14 (D15) is formed adjacently to at least one of the elements constituting the excessive magnetic field protection circuit 231 (the stabilization circuit 232). When the excessive magnetic field protection circuit 231 and the stabilization circuit 232 are constituted of discrete components, the diode D14 (D15) may contact at least one of the elements.

As the PN junction diodes D14 and D15, for example, diodes having a forward voltage of 0.7 volts and a temperature characteristic of −1.5 [mV/° C.] are used. Thus, when a bias current flows into the diodes D14 and D15 through the resistor R14, the voltage of the anodes of the diodes D14 and D15 vary in accordance with the temperature of heat generated by the excessive magnetic field protection circuit 231 and the stabilization circuit 232, respectively. The temperature measurement circuit 233 outputs the voltage of the anode of each of the diodes D14 and D15 as the measured temperature signal SM2, which represents a measured temperature. The measured temperature is the temperature of one of the diodes D14 and D15 exposed to a higher temperature. The temperature measurement circuit 233 measures the temperature of one of the excessive magnetic field protection circuit 231 and the stabilization circuit 232 having a higher heating value, thus being favorable for safety. Since the temperature measurement circuit 233 is electrically insulated from the excessive magnetic field protection circuit 231 and the stabilization circuit 232, the temperature measurement circuit 233 can operate reliably without being affected by noise owing to high-frequency currents flowing through the excessive magnetic field protection circuit 231 and the stabilization circuit 232.

On the basis of the measured temperature signal SM2 generated by the temperature measurement circuit 233, a voltage and a current applied to the transistors or diodes formed in the excessive magnetic field protection circuit 231 and the stabilization circuit 232 can be estimated. Thus, amount of power loss of the wireless power receiving device 200 can be obtained on the basis of the measured temperature signal SM2. When the amount of the power loss is estimated on the basis of the measured temperature signal SM2 to be lower than a predetermined level, the control circuit 27 determines that power supply is performed favorably. On the other hand, when the amount of the power loss is estimated to be higher than the predetermined level, the control circuit 27 determines that power supply has reduced efficiency, and may issue a command for matching change and the like to the wireless power feeding device 100. When the power loss is estimated on the basis of the measured temperature signal SM2 to be excessive, the control circuit 27 may perform a protection operation, for example, cutout of electrical connection between the line L5 and the power reception circuit 23 for safety's sake.

Accordingly, providing the temperature measurement circuit 233 increases the efficiency of the wireless power receiving device 200 while saving power, and secures the safety of the operation.

In the temperature measurement circuit 233, the PN junction diodes D14 and D15 are provided in the vicinity of the excessive magnetic field protection circuit 231 and the stabilization circuit 232, respectively, as temperature sensors, but the temperature sensor may be provided in the vicinity of only one of the excessive magnetic field protection circuit 231 and the stabilization circuit 232. Alternatively, two or more diodes may be provided in the vicinity of each of the excessive magnetic field protection circuit 231 and the stabilization circuit 232, as temperature sensors. Thermistor circuits for measuring the temperature of a secondary battery may be used instead of the PN junction diodes.

In the configuration shown in FIGS. 1 to 3, the drive circuits (103 and 104) are connected to one end and the other end of the power transmission coil 12, respectively, and the rectifier circuit is connected between both ends of the power reception coil 20. However, the ground potential GND may be applied to one end of the power transmission coil 12, while the other end thereof may be connected to a drive circuit. The ground potential GND may be applied to one end of the power reception coil 20, while the other end thereof may be connected to a rectifier circuit.

The example of FIG. 1 adopts the so-called parallel resonance circuit, in which the resonance capacitor 11 is connected in parallel with the power transmission coil 12 and the resonance capacitor 21 is connected in parallel with the power reception coil 20, but other circuitry such as a series resonance circuit in which a resonance capacitor and a coil are connected in series may be used instead.

In the example of FIGS. 2 and 3, the current measurement resistor R1 is connected to the source of the p-channel MOS transistor P3 of the output inverter 103, and the current measurement resistor R2 is connected to the source of the p-channel MOS transistor P6 of the output inverter 104. However, a current measurement resistor may be provided in at least one of the output inverters 103 and 104, or may be connected to the source of each of the plurality of p-channel MOS transistors. A current measurement resistor may be connected to the source of the n-channel MOS transistor.

In other words, the wireless power feeding device 100 is required to include at least the following first to Nth switching elements, current measurement resistor, and current measurement circuit. The first to Nth switching elements (for example, P1 to P6 or N1 to N6) are connected in parallel between the power line (VL) and the ground line (GL). Each of the switching elements independently supplies a current to a drive line (L1 or L2) connected to one end of a power transmission coil (12) in accordance with an oscillation signal (fc or fcB). The current measurement resistor (R1 or R2) is connected in series with the first switching element (for example, P3, P6, N3, or N6) between the power line and the ground line. The current measurement circuit (105a) generates a measured current signal (GC1r) representing the amount of a drive current on the basis of the potential of one end of the resistor (R1 or R2).

The rectifier circuit 22 of FIG. 1 rectifies and detects the high frequency signal using the diodes. However, the transistors of the drive circuit pass a current only in one direction, and therefore sometimes equivalently rectify and detect the current. In such a case, the diodes of the rectifier circuit 22 may be omitted.

As the temperature sensor for the temperature measurement circuit (106 or 233), a plurality of PN junction diodes, a bipolar transistor, or an element using a MOS threshold value may be used, as well as the PN junction diode. A PTAT circuit (absolute temperature-proportional circuit), an element using a temperature characteristic of a resistor, a thermistor, and the like may be used as the temperature sensor.

The stabilization circuit 232 of FIG. 8 uses a series regulator circuit (linear regulator) by gate voltage control using the p-channel MOS transistor QP0, but may use a switching regulator having negative feedback control instead.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims.

This application is based upon and claims the benefit of priority from the prior Japanese Patent Application No. 2016-227041 filed on Nov. 22, 2016, the entire contents of which are incorporated herein by reference.

What is claimed is:

1. A wireless power feeding device for performing wireless power feeding via a power transmission coil by supplying a drive current to the power transmission coil on the basis of an oscillation signal so as to generate an alternating current magnetic field, the wireless power feeding device comprising:
    a drive line having one end thereof connected to one end of the power transmission coil;
    first to Nth (N is an integer of 2 or more) switching elements connected in parallel to each other between a power line and a ground line, each of the first to Nth switching elements supplying a current to the other end of the drive line in response to the oscillation signal;
    a first resistor connected in series with the first switching element between the power line and the ground line; and
    a current measurement circuit for generating a first measured current signal representing an amount of the drive current on the basis of a potential of one end of the first resistor.

2. The wireless power feeding device according to claim 1, wherein the first to Nth switching elements are first to Nth p-channel MOS transistors, respectively, and the oscillation signal is supplied to a gate of each of the first to Nth p-channel MOS transistors.

3. The wireless power feeding device according to claim 2, comprising:
    first to N-th n-channel transistors of an n-channel MOS type connected between the power line and the ground line, wherein the oscillation signal is supplied to a gate of each of the first to Nth n-channel transistors.

4. The wireless power feeding device according to claim 3, comprising:
a second resistor connected in series with the first n-channel transistor between the power line and the ground line, wherein
the current measurement circuit generates a second measured current signal representing a complex component of the drive current, on the basis of a multiplication value of a potential of one end of the second resistor by the oscillation signal.

5. The wireless power feeding device according to claim 3, comprising:
a second resistor connected in series with the first n-channel transistor between the power line and the ground line, wherein
the current measurement circuit generates a second measured current signal representing a complex component of the drive current, on the basis of a multiplication result of a potential of one end of the second resistor by a potential of the drive line.

6. The wireless power feeding device according to claim 1, comprising a temperature measurement circuit formed so as to be in contact with or in a vicinity of at least one of the first to Nth switching elements, the temperature measurement circuit measuring a temperature of the at least one of the switching elements and generating a temperature signal.

7. A wireless power receiving device for receiving a rectified voltage of an alternating current voltage obtained by a power reception coil in an alternating current magnetic field as a received supply voltage, and generating an output voltage having a predetermined voltage value on the basis of the received supply voltage, the wireless power receiving device comprising:
a first line for receiving the received supply voltage;
an excessive magnetic field protection circuit for generating a magnetic field strength signal representing a strength of the alternating current magnetic field on the basis of the received supply voltage of the first line, and when the strength of the alternating current magnetic field is higher than a predetermined strength, the excessive magnetic field protection circuit fixing a voltage value of the first line at a predetermined voltage; and
a stabilization circuit including a current detection unit for measuring an amount of a current flowing through the first line and generating a measured current signal representing the amount of the current; an overcurrent detection unit for detecting an overcurrent flowing through the first line and generating an overcurrent detection signal representing the overcurrent; a voltage detection unit for measuring the voltage value of the output voltage and generating a measured voltage signal representing the voltage value; and a voltage adjustment unit for adjusting the voltage value of the first line on the basis of a difference between a potential of one of the measured current signal, the overcurrent detection signal, and the measured voltage signal having the highest strength and a reference potential, and outputting the adjusted voltage as the output voltage.

8. The wireless power receiving device according to claim 7, wherein
the excessive magnetic field protection circuit includes:
a Zener diode connected between the first line and a ground line; and
a voltage dividing resistor for generating a divided voltage into which a voltage between the first line and the ground line is divided, as the magnetic field strength signal.

9. A wireless power supply system comprising: a wireless power feeding device including a power transmission circuit for generating a drive current on the basis of an oscillation signal, and a power transmission coil for generating an alternating current magnetic field by receiving the drive current; and a wireless power receiving device including a power reception coil for generating an alternating current voltage by receiving the alternating current magnetic field, a rectifier circuit for obtaining a rectified voltage of the alternating current voltage as a received supply voltage, and a power reception circuit for generating an output voltage having a predetermined voltage value on the basis of the received supply voltage, wherein
the power transmission circuit includes:
a drive line having one end thereof connected to one end of the power transmission coil;
first to Nth (N is an integer of 2 or more) switching elements connected in parallel to each other between a power line and a ground line, each of the first to Nth switching elements supplying a current to the other end of the drive line in response to the oscillation signal;
a first resistor connected in series with the first switching element between the power line and the ground line; and
a current measurement circuit for generating a first measured current signal representing an amount of the drive current on the basis of a potential of one end of the first resistor, and
the power reception circuit includes:
first line for receiving the received supply voltage;
an excessive magnetic field protection circuit for generating a magnetic field strength signal representing a strength of the alternating current magnetic field on the basis of the received supply voltage of the first line, and when the strength of the alternating current magnetic field is higher than a predetermined strength, the excessive magnetic field protection circuit fixing a voltage value of the first line at a predetermined voltage; and
a stabilization circuit including a current detection unit for measuring an amount of a current flowing through the first line and generating a measured current signal representing the amount of the current; an overcurrent detection unit for detecting an overcurrent flowing through the first line and generating an overcurrent detection signal representing the overcurrent; a voltage detection unit for measuring the voltage value of the output voltage and generating a measured voltage signal representing the voltage value; and a voltage adjustment unit for adjusting the voltage value of the first line on the basis of a difference between a potential of one of the measured current signal, the overcurrent detection signal, and the measured voltage signal having the highest strength and a reference potential, and outputting the adjusted voltage as the output voltage.

10. A method for measuring a current of a wireless power feeding device, the wireless power feeding device performing wireless power feeding via a transmission coil by supplying a drive current to the power transmission coil on the basis of an oscillation signal so as to generate an alternating current magnetic field, the method comprising:

intermittently outputting a current from each of first to Nth (N is an integer of 2 or more) switching elements in accordance with the oscillation signal, and supplying a composite current into which the currents outputted from the first to Nth switching elements are combined to the power transmission coil as the drive current; and generating a measured current signal representing an amount of the drive current on the basis of a potential of one end of a resistor connected in series to only the first switching element of the first to Nth switching elements.

\* \* \* \* \*